United States Patent
Smith et al.

(10) Patent No.: US 8,541,803 B2
(45) Date of Patent: Sep. 24, 2013

(54) CADMIUM-FREE RE-EMITTING SEMICONDUCTOR CONSTRUCTION

(75) Inventors: Terry L. Smith, Roseville, MN (US);
Michael A. Haase, St. Paul, MN (US);
Thomas J. Miller, Woodbury, MN (US);
Xiaoguang Sun, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 13/379,858

(22) PCT Filed: Jun. 25, 2010

(86) PCT No.: PCT/US2010/040038
§ 371 (c)(1),
(2), (4) Date: Dec. 21, 2011

(87) PCT Pub. No.: WO2011/008476
PCT Pub. Date: Jan. 20, 2011

(65) Prior Publication Data
US 2012/0097921 A1    Apr. 26, 2012

Related U.S. Application Data

(60) Provisional application No. 61/221,852, filed on Jun. 30, 2009, provisional application No. 61/175,640, filed on May 5, 2009, provisional application No. 61/175,632, filed on May 5, 2009, provisional application No. 61/175,636, filed on May 5, 2009.

(51) Int. Cl.
*H01L 33/50* (2010.01)
*H01L 33/00* (2010.01)

(52) U.S. Cl.
USPC ............. 257/98; 257/13; 257/88; 257/103; 257/E21.461; 257/E33.005; 257/E33.056; 438/27; 438/29; 438/47

(58) Field of Classification Search
USPC ........ 257/13, 88, 98, 103, E21.461, E33.005, 257/E33.056; 438/27, 29, 47
See application file for complete search history.

(56) References Cited

U.S. PATENT DOCUMENTS

| 3,526,801 A | 9/1970 | Kruse |
|---|---|---|
| 5,048,035 A | 9/1991 | Sugawara |

(Continued)

FOREIGN PATENT DOCUMENTS

| DE | 103 54 936 | 4/2005 |
|---|---|---|
| EP | 1 010 773 | 6/2000 |

(Continued)

OTHER PUBLICATIONS

Cavus et al., "N-type doping of lattice-matched ZnCdSe and ZnxCdyMg1-x-ySe epilayers on InP using ZnCl2", Journal of Applied Physics, vol. 84, No. 3, pp. 1472-1475, Aug. 1, 1998, © 1998 American Institute of Physics.

(Continued)

*Primary Examiner* — Dao H Nguyen
(74) *Attorney, Agent, or Firm* — Daniel J. Iden

(57) ABSTRACT

Disclosed re-emitting semiconductor constructions (RSCs) may provide full-color RGB or white-light emitting devices that are free of cadmium. Some embodiments may include a potential well that comprises a III-V semiconductor and that converts light of a first photon energy to light of a smaller photon energy, and a window that comprises a II-VI semiconductor having a band gap energy greater than the first photon energy. Some embodiments may include a potential well that converts light having a first photon energy to light having a smaller photon energy and that comprises a II-VI semiconductor that is substantially Cd-free. Some embodiments may include a potential well that comprises a first III-V semiconductor and that converts light having a first photon energy to light having a smaller photon energy, and a window that comprises a second III-V semiconductor and that has a band gap energy greater than the first photon energy.

18 Claims, 7 Drawing Sheets

(56) References Cited

U.S. PATENT DOCUMENTS

| | | | |
|---|---|---|---|
| 5,538,918 A * | 7/1996 | Haase et al. | 438/29 |
| 5,600,158 A | 2/1997 | Noto | |
| 5,861,717 A | 1/1999 | Begemann | |
| 6,016,038 A | 1/2000 | Mueller | |
| 6,583,450 B1 * | 6/2003 | Miller | 257/103 |
| 6,636,003 B2 | 10/2003 | Rahm | |
| 6,902,987 B1 | 6/2005 | Tong | |
| 7,026,653 B2 | 4/2006 | Sun | |
| 7,078,319 B2 | 7/2006 | Eliashevich | |
| 7,126,160 B2 | 10/2006 | Sun | |
| 7,141,445 B2 | 11/2006 | Sugawara | |
| 7,202,613 B2 | 4/2007 | Morgan | |
| 7,217,959 B2 | 5/2007 | Chen | |
| 7,223,998 B2 | 5/2007 | Schwach | |
| 7,279,716 B2 | 10/2007 | Chen | |
| 7,288,902 B1 | 10/2007 | Melanson | |
| 7,358,679 B2 | 4/2008 | Lys | |
| 7,361,938 B2 | 4/2008 | Mueller | |
| 7,387,405 B2 | 6/2008 | Ducharme | |
| 7,402,831 B2 | 7/2008 | Miller | |
| 7,417,260 B2 | 8/2008 | Wuu | |
| 8,089,074 B2 * | 1/2012 | Kim et al. | 257/79 |
| 2002/0182319 A1 | 12/2002 | Ben-Malek | |
| 2003/0010987 A1 | 1/2003 | Banin | |
| 2005/0110034 A1 | 5/2005 | Fujiwara | |
| 2005/0230693 A1 | 10/2005 | Chen | |
| 2005/0274967 A1 | 12/2005 | Martin | |
| 2005/0280013 A1 | 12/2005 | Sun | |
| 2006/0001056 A1 | 1/2006 | Saxler | |
| 2006/0093001 A1 * | 5/2006 | Ryu et al. | 372/43.01 |
| 2006/0124917 A1 | 6/2006 | Miller | |
| 2006/0202215 A1 | 9/2006 | Wierer, Jr. | |
| 2007/0221867 A1 | 9/2007 | Beeson | |
| 2007/0284565 A1 | 12/2007 | Leatherdale | |
| 2007/0290190 A1 | 12/2007 | Haase | |
| 2008/0111123 A1 | 5/2008 | Tu | |
| 2008/0230795 A1 | 9/2008 | Dias | |
| 2008/0272712 A1 | 11/2008 | Jalink | |
| 2008/0297027 A1 | 12/2008 | Miller | |
| 2009/0014736 A1 | 1/2009 | Ibbetson | |
| 2009/0108269 A1 | 4/2009 | Negley | |
| 2010/0117997 A1 | 5/2010 | Haase | |
| 2010/0283074 A1 * | 11/2010 | Kelley et al. | 438/29 |
| 2011/0256648 A1 * | 10/2011 | Kelley et al. | 438/29 |

FOREIGN PATENT DOCUMENTS

| | | |
|---|---|---|
| EP | 1 517 379 | 3/2005 |
| JP | 61-144078 | 7/1986 |
| JP | 2000-091707 | 3/2000 |
| KR | 10-0829925 | 8/2008 |
| WO | WO 00/76005 | 12/2000 |
| WO | WO 2006/062588 | 6/2006 |
| WO | WO 2007/034367 | 3/2007 |
| WO | WO 2007/073449 | 6/2007 |
| WO | WO 2007/114614 | 10/2007 |
| WO | WO 2008/109296 | 9/2008 |
| WO | WO 2009/036579 | 3/2009 |
| WO | WO 2009/048704 | 4/2009 |
| WO | WO 2009/148717 | 12/2009 |
| WO | WO 2009/158191 | 12/2009 |
| WO | WO 2010/019594 | 2/2010 |
| WO | WO 2010/027648 | 3/2010 |
| WO | WO 2010/028146 | 6/2010 |
| WO | WO 2009/158138 | 7/2010 |
| WO | WO 2010/074987 | 7/2010 |
| WO | WO 2010/033379 | 11/2010 |
| WO | WO 2010/129409 | 11/2010 |
| WO | WO 2010/129412 | 11/2010 |
| WO | WO 2011/002686 | 1/2011 |
| WO | WO 2011/008474 | 1/2011 |

OTHER PUBLICATIONS

Chang et al., "MBE Growth and Characterization of (ZnMG) (SeTe)", Journal of the Korean Physical Society, vol. 34, pp. S4-S6, Apr. 1999.

CIE, International Commission On Illumination, Technical Report, ISBN 978 3 900734 57 2, 13.3, 1995.

Guo et al., "Photon Recycling Semiconductor Light Emitting Diode", IEEE Xplore, 4 pages, Downloaded on Oct. 29, 2008, © 1999 IEEE.

Horng et al., "Phosphor-Free White Light From InGaN Blue and Green Light-Emitting Diode Chips Covered With Semiconductor-Conversion AlGaInP Epilayer", IEEE Photonics Technology Letters, vol. 20, No. 13, pp. 1139-1141, Jul. 1, 2008.

Horng et al., "Red-enhanced white light-emitting diodes using external AlGaInP epilayers with various aperture ratios", Journal of Luminescence, vol. 128, pp. 647-651, 2008, © 2007 Elsevier B.V.

Jones, E. D., "Diffusion of Indium Into Cadmium Sulphide", Journal of Physical Chemistry Solids, vol. 39, pp. 11-18, Pergamon Press, Great Britain, 1978.

Kobayashi, Naoki, "Single quantum well photoluminescence in ZnSe/GaAs/AlGaAs grown by migration-enhanced epitaxy", Applied Physics Letters, vol. 55, No. 12, pp. 1235-1237, Sep. 18, 1989, © 1989 American Institute of Physics.

Krystek, M., "An Algorithm to Calculate Correlated Colour Temperature", Color Research and Application, vol. 10, pp. 38-40, © 1985 by John Wiley & Sons, Inc.

Litz et al., "Epitaxy of $Zn_{1-x}Mg_xSe_yTe_{1-y}$ on (100) InAs", Journals of Crystal Growth, vol. 159, pp. 54-57, 1999.

Odnoblyudov, V.A. and Tu, C. W., "Gas-source molecular-beam eptitaxial growth of Ga(In)NP on GaP(100) substrates for yellow-amber light-emitting devices", Journal of Vacuum Science and Technology B, vol. 23, No. 3, pp. 1317-1319, May/Jun. 2005, ©2005 American Vacuum Society.

Official Journal of the European Union, "Directive 2002/95/EC of the European Parliament and of the Council, of Jan. 27, 2003, on the restriction of the use of certain hazardous substances in electrical equipment", pp. L 37/19 to L 37/23, Feb 2, 2003.

Official Journal of the European Union, "Commission Decision, of Aug. 18, 2005, amending Directive 2002/95/EC of the European Parliament and of the Council for the purpose of establishing the maximum concentration values for certain hazardous substances in electrical and electronic equipment", 2005/618/EC, p. L 214/65, Aug. 19, 2005.

Sethi, B.R. and Mather P. C., "Effect of Heavy Doping of ZnSe Crystals with Indium in Creating Compensating Acceptors", Physica Status Solidi. (a), pp. 717-721, 1978.

Search Report for International Application No. PCT/US2010/040038, 6 pages, Date of Mailing Jul. 12, 2010.

Schubert, Fred E., Light Emitting Diodes, pp. 133-144, Second Edition, Universtity Press, Cambridge, U.K., © E. Fred Schubert, 2006.

Schubert, Fred E., Light Emitting Diodes, pp. 209-211, Second Edition, Universtity Press, Cambridge, U.K., © E. Fred Schubert, 2006.

Takashima et al., "Proposal of a novel BeZnSeTe quaternary for II-VI middle range visible light emitting devices on InP substrates", Physica Status Solidi (b), vol. 241, No. 3, pp. 747-750, © 2004 Wiley-VCH.

Zeng et al., "Red-green-blue photopumped lasing from ZnCdMgSe/ZnCdSe quantum well laser structures grown on Inp", Applied Physics Letters, vol. 72, No. 24, pp. 3136-3138, Jun. 15, 1998, © 1998 American Institute of Physics.

Written Opinion for International Application No. PCT/US2010/040038, 11 pages, Date of Mailing Jul. 12, 2010.

* cited by examiner ures that reference that text being reference text made understand being reference is being wavelength. The VCSEL converts at least a portion of a first wavelength light emitted by a pump light source to at least a partially coherent light at a second wavelength. The VCSEL includes a semiconductor multilayer stack that is disposed between first and second mirrors and converts at least a portion of the first wavelength light to the second wavelength light. The semiconductor multilayer stack includes a quantum well that may include a Cd(Mg)ZnSe alloy. Reference is made to pending U.S. Patent Application Ser. No. 61/094, 270, "Diode-Pumped Light Source", filed Sep. 4, 2008, incorporated herein by reference.

CADMIUM-FREE RE-EMITTING SEMICONDUCTOR CONSTRUCTION

CROSS REFERENCE TO RELATED APPLICATIONS

This application is a national stage filing under 35 U.S.C. 371 of PCT/US2010/040038, filed on Jun. 25, 2010, which claims priority to U.S. Provisional Application No.61/221, 852, filed on Jun. 30, 2009, the disclosure of which is incorporated by reference in its/their entirety herein.

Reference is made to the following pending U.S. patent applications, the features of which can be incorporated into the embodiments presently disclosed: U.S. Application Ser. No. 61/175,640, "Re-Emitting Semiconductor Construction With Enhanced Extraction Efficiency", filed May 5, 2009; U.S. Application Ser. No. 61/175,632, "Semiconductor Devices Grown on Indium-Containing Substrates Utilizing Indium Depletion Mechanisms", filed May 5, 2009; and U.S. Application Ser. No. 61/175,636, "Re-Emitting Semiconductor Carrier Devices For Use With LEDs and Methods of Manufacture", filed May 5, 2009.

FIELD OF THE INVENTION

This invention relates generally to solid state semiconductor light sources.

BACKGROUND

A wide variety of semiconductor devices, and methods of making semiconductor devices, are known. Some of these devices are designed to emit light, such as visible or near-visible (e.g. ultraviolet or near infrared) light. Examples include electroluminescent devices such as light emitting diodes (LEDs) and laser diodes, wherein an electrical drive current or similar electrical signal is applied to the device so that it emits light. Another example of a semiconductor device designed to emit light is a re-emitting semiconductor construction (RSC).

Unlike an LED, an RSC does not require an electrical drive current from an external electronic circuit in order to emit light. Instead, the RSC generates electron-hole pairs by absorption of light at a first wavelength $\lambda_1$ in an active region of the RSC. These electrons and holes then recombine in potential wells in the active region to emit light at a second wavelength $\lambda_2$ different from the first wavelength $\lambda_1$, and optionally at still other wavelengths $\lambda_3$, $\lambda_4$, and so forth depending on the number of potential wells and their design features. The initiating radiation or "pump light" at the first wavelength $\lambda_1$ is typically provided by a blue, violet, or ultraviolet emitting LED coupled to the RSC. Exemplary RSC devices, methods of their construction, and related devices and methods can be found in, e.g., U.S. Pat. No. 7,402,831 (Miller et al.), U.S. Patent Application Publications US 2007/0284565 (Leatherdale et al.) and US 2007/0290190 (Haase et al.), PCT Publication WO 2009/048704 (Kelley et al.), and pending U.S. Application Ser. No. 61/075,918, "Semiconductor Light Converting Construction", filed Jun. 26, 2008, all of which are incorporated herein by reference.

When reference is made herein to a light at a particular wavelength, the reader will understand that reference is being made to light having a spectrum whose peak wavelength is at the particular wavelength.

An optically-pumped vertical cavity surface emitting laser (VCSEL) can be considered to be a type of RSC, and is another example of a semiconductor device designed to emit light.

Of some interest to the present application are light sources that are capable of emitting white light. In some cases, known white light sources are constructed by combining an electroluminescent device such as a blue-emitting LED with first and second RSC-based luminescent elements. The first luminescent element may, for example, include a green-emitting potential well that converts some of the blue light to green light, and transmits the remainder of the blue light. The second luminescent element may include a potential well that converts some of the green and/or blue light it receives from the first luminescent element into red light, and transmits the remainder of the blue and green light. The resulting red, green, and blue light components combine to allow such a device, which is described (among other embodiments) in WO 2008/109296 (Haase), to provide substantially white light output.

Some devices provide white light using a pixelated arrangement or array. That is, multiple individual light-emitting elements, none of which emit white light by themselves, are arranged in close proximity to each other so as to collectively form a composite white pixel. The pixel typically has a characteristic dimension or size below the resolution limit of the observation system, so that light from the different light-emitting elements is effectively combined in the observation system. A common arrangement for such a device is for three individual light-emitting elements—one emitting red (R) light, one emitting green (G) light, one emitting blue (B) light—to form an "RGB" pixel. Large arrays of the colored light-emitting elements may be addressed in such a way to form a color image. Reference is again made to WO 2008/109296 (Haase), for disclosure of some such devices.

FIG. 1 shows an illustrative device 100 that combines an RSC 108 and an LED 102. The LED has a stack of LED semiconductor layers 104, sometimes referred to as epilayers, on an LED substrate 106. The layers 104 may include p- and n-type junction layers, light emitting layers (typically containing quantum wells), buffer layers, and superstrate layers. The layers 104 may be attached to the LED substrate 106 via an optional bonding layer 116. The LED has an upper surface 112 and a lower surface, and the upper surface is textured to increase extraction of light from the LED compared to the case where the upper surface is flat. Electrodes 118, 120 may be provided on these upper and lower surfaces, as shown. When connected to a suitable power source through these electrodes, the LED emits light at a first wavelength $\lambda_1$, which may correspond to blue, violet, or ultraviolet (UV) light. Some of this LED light enters the RSC 108 and is absorbed there.

The RSC 108 is attached to the upper surface 112 of the LED via a bonding layer 110. The RSC has upper and lower surfaces 122, 124, with pump light from the LED entering through the lower surface 124. Either one or both of the upper and lower surfaces can be textured to aid in light extraction. The RSC also includes a quantum well structure 114 engineered so that the band gap in portions of the structure is selected so that at least some of the pump light emitted by the LED 102 is absorbed. The charge carriers generated by absorption of the pump light diffuse into other portions of the structure having a smaller band gap, the quantum well layers, where the carriers recombine and generate light at the longer wavelength. This is depicted in FIG. 1 by the re-emitted light at the second wavelength $\lambda_2$ originating from within the RSC 108 and exiting the RSC to provide output light.

FIG. 2 shows an illustrative semiconductor layer stack 210 comprising an RSC. The stack was grown using molecular beam epitaxy (MBE) on an indium phosphide (InP) wafer. A GaInAs buffer layer was first grown by MBE on the InP substrate to prepare the surface for II-VI growth. The wafer was then moved through an ultra-high vacuum transfer system to another MBE chamber for growth of II-VI epitaxial layers used in the RSC. Details of the as-grown RSC are shown in FIG. 2 and summarized in Table 1. The table lists the thickness, material composition, band gap, and layer description for the different layers associated with the RSC. The RSC included eight CdZnSe quantum wells 230, each having a transition energy of 2.15 eV. Each quantum well 230 was sandwiched between CdMgZnSe absorber layers 232 having a band gap energy of 2.48 eV that could absorb blue light emitted by an LED. The RSC also included various window, buffer, and grading layers.

TABLE 1

| Reference No. | Material | Thickness (nm) | Band Gap/Transition (eV) | Comment |
|---|---|---|---|---|
| 230 | $Cd_{0.48}Zn_{0.52}Se$ | 3.1 | 2.15 | quantum well |
| 232 | $Cd_{0.38}Mg_{0.21}Zn_{0.41}Se$ | 8 | 2.48 | absorber |
| 234 | $Cd_{0.38}Mg_{0.21}Zn_{0.41}Se$:Cl | 92 | 2.48 | absorber |
| 236 | $Cd_{0.22}Mg_{0.45}Zn_{0.33}Se$ | 100 | 2.93 | window |
| 238 | $Cd_{0.22}Mg_{0.45}Zn_{0.33}Se \rightarrow Cd_{0.38}Mg_{0.21}Zn_{0.41}Se$ | 250 | 2.93–2.48 | grading |
| 240 | $Cd_{0.38}Mg_{0.21}Zn_{0.41}Se$:Cl | 46 | 2.48 | absorber |
| 242 | $Cd_{0.38}Mg_{0.21}Zn_{0.41}Se \rightarrow Cd_{0.22}Mg_{0.45}Zn_{0.33}Se$ | 250 | 2.48–2.93 | grading |
| 244 | $Cd_{0.39}Zn_{0.61}Se$ | 4.4 | 2.24 | II-VI buffer |
| 246 | $Ga_{0.47}In_{0.53}As$ | 190 | 0.77 | III-V buffer |
| 224 | InP | 350,000 | 1.35 | III-V substrate |

Further details of this and other RSC devices can be found in PCT Publication WO 2009/048704 (Kelley et al.).

As demonstrated by the foregoing example, CdMgZnSe alloys are particularly advantageous in the manufacture of RSC devices. Notably, alloys of CdMgZnSe (which for purposes of the present discussion also include CdZnSe) can be made over a wide range of band gap energies and with lattice constants that conveniently allow for their formation as lattice-matched or pseudomorphic multilayer stacks on useful semiconductor substrates. For example, by simply controlling the composition of the CdMgZnSe alloy during the epitaxial growth process, a stack of CdMgZnSe-based semiconductor layers having appropriate thicknesses and band gap energies can be produced on an InP substrate, the semiconductor layer stack containing substantially all of the necessary or desirable components of an RSC so that the resulting RSC, in one embodiment, converts blue pump light to green re-emitted light, and in another embodiment converts blue pump light to red re-emitted light, and in still another embodiment converts blue pump light to both green and red re-emitted light. It is therefore possible to fabricate an RGB pixelated or other white light source by combining a blue-emitting electroluminescent device with one or more RSCs that are entirely or predominantly composed of CdMgZnSe-based materials.

BRIEF SUMMARY

In recent years, actions have been discussed and/or taken by various groups or entities to limit the use of certain substances based on potential environmental and/or health issues. One such substance is cadmium. Therefore, even though cadmium may be present in only miniscule amounts in a typical CdMgZnSe-based RSC, and even though the cadmium atoms in CdMgZnSe alloys are strongly bound to the lattice structure of the semiconductor material, it may nevertheless be desirable to find alternative approaches that allow for the production of efficient RSC devices, including in some instances RGB arrays, that substantially avoid the use of cadmium-containing materials. At least some of the disclosed embodiments are therefore directed to or at least compatible with light-emitting devices or components thereof that are substantially cadmium-free. However, the reader should understand that many of the disclosed embodiments need not be cadmium-free, and can be employed advantageously in a variety of settings even though one or more constituent components may contain a substantial amount of cadmium.

The present application discloses, inter alia, semiconductor constructions that include a first potential well and a window. The first potential well comprises a first III-V semiconductor, and is adapted to convert light having a first photon energy to light having a smaller second photon energy. The window comprises a first II-VI semiconductor, and has a band gap energy greater than the first photon energy.

In exemplary embodiments, the first potential well may be pseudomorphic, and the window may be substantially Cd-free. The window and/or the entire semiconductor construction may be compliant with the RoHS Directive, discussed further below. The light having the first photon energy may include UV, violet, blue, and/or green light. The light having the second photon energy may include red light. The semiconductor construction may be pseudomorphic and disposed on a substrate comprising a second III-V semiconductor, such as GaAs. The first III-V semiconductor may comprise GaInP or AlGaInP. The first II-VI semiconductor may comprise BeMgZnSe or BeZnSe, or may comprise MgZnSSe or BeZnSSe, for example. The first potential well may be a component of a stack of pseudomorphic semiconductor layers including one or more absorber layers and optionally one or more additional potential wells, and the layers of the stack may each comprise AlGaInP. The first potential well may be a component of a stack of pseudomorphic semiconductor layers including one or more absorber layers and optionally one or more additional potential wells, and the stack of semiconductor layers may be substantially Cd-free. The semiconductor construction may also be disposed on a light source adapted to emit light having the first photon energy, and a second potential well for converting light having the first photon energy to light having a third photon energy smaller than the first photon energy and greater than the second photon energy, the second potential well comprising a second II-VI semiconductor. The light having the first photon energy may include UV, violet, and/or blue light, and the light having the third photon energy may include green light. Alternatively, the semiconductor construction may be combined with a light source adapted to emit light having a third photon energy greater than the first photon energy, and a second potential well that includes a second II-VI semiconductor for converting the light having the third photon energy to the light having the first photon energy. In such case the second II-VI semiconductor may include MgZnSeTe, ZnSeTe, BeMgZnSe, or MgZnSSe, and the light having the third photon energy may include UV, violet, and/or blue light, and the light having the first photon energy may include green light, and the light having the second photon energy may include red light.

The present application also discloses semiconductor constructions that include a first potential well that comprises a first II-VI semiconductor, the first potential well being adapted to convert light having a first photon energy to light having a smaller second photon energy. This first potential well is substantially Cd-free.

In exemplary embodiments, the first II-VI material may be pseudomorphic to InP, and may comprise MgZnSeTe, ZnSeTe, BeMgZnSe, or MgZnSSe, for example. The light having the first photon energy may include UV, violet, and/or blue light, and the light having the second photon energy may include green light. The semiconductor construction may also be combined with a light source adapted to emit the light having the first photon energy.

The present application also discloses semiconductor constructions that include a first potential well and a window. The first potential well comprises a first III-V semiconductor, and is adapted to convert light having a first photon energy to light having a smaller second photon energy. The window comprises a second III-V semiconductor, and has a band gap energy greater than the first photon energy.

In exemplary embodiments, the first potential well may be lattice-matched to the window, and/or the second III-V semiconductor may have an indirect band gap. Furthermore, the semiconductor construction may also include a second potential well that comprises a first II-VI semiconductor, and that is adapted to convert light having a third photon energy to the light having the first photon energy. The second potential well may be substantially Cd-free. The light having the third photon energy may include blue, violet, and/or UV light, and the light having the first photon energy may include green light, and the light having the second photon energy may include red light. The first III-V semiconductor may comprise AlGaInP, the second III-V semiconductor may comprise AlInP, and the first II-VI semiconductor may comprise MgZnSeTe, ZnSeTe, BeMgZnSe, or MgZnSSe, for example.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

In this application:

"lattice-matched" means, with reference to two crystalline materials, such as an epitaxial film on a substrate, that each material taken in isolation has a lattice constant, and that these lattice constants are substantially equal, typically not more than 0.2% different from each other, more typically not more than 0.1% different from each other, and most typically not more than 0.01% different from each other;

"pseudomorphic" means, with reference to a first crystalline layer of a given thickness and a second crystalline layer, such as an epitaxial film and a substrate, that each layer taken in isolation has a lattice constant, and that these lattice constants are sufficiently similar so that the first layer, in the given thickness, can adopt the lattice spacing of the second layer in the plane of the layer substantially without misfit defects; and "potential well" refers to semiconductor layer(s) in a multilayer semiconductor structure designed to confine a carrier in one dimension only, where the semiconductor layer(s) has a lower conduction band energy than surrounding layers and/or a higher valence band energy than surrounding layers. Quantum well generally means a potential well that is so thin that quantization effects increase the energy for electron-hole pair recombination in the well. A quantum well typically has a thickness of about 100 nm or less, or about 10 nm or less.

Furthermore, if a layer or component is said to be "substantially Cd-free", or the like, it means that that layer or component contains Cd, if at all, in an amount less than 0.01% by weight.

The "RoHS Directive" refers to Directive 2002/95/EC of the European Parliament and of the Council of 27 Jan. 2003 on the restriction of the use of certain hazardous substances in electrical and electronic equipment, commonly referred to as the Restriction of Hazardous Substances Directive or simply "RoHS", published in the Official Journal of the European Union on 13 Feb. 2003, and as further amended by the Commission Decision of 18 Aug. 2005 as published 19 Aug. 2005 in the Official Journal of the European Union under the designation 2005/618/EC.

BRIEF DESCRIPTION OF DRAWINGS

In the figures, like reference numerals designate like elements.

DETAILED DESCRIPTION OF ILLUSTRATIVE EMBODIMENTS

Figure 1:
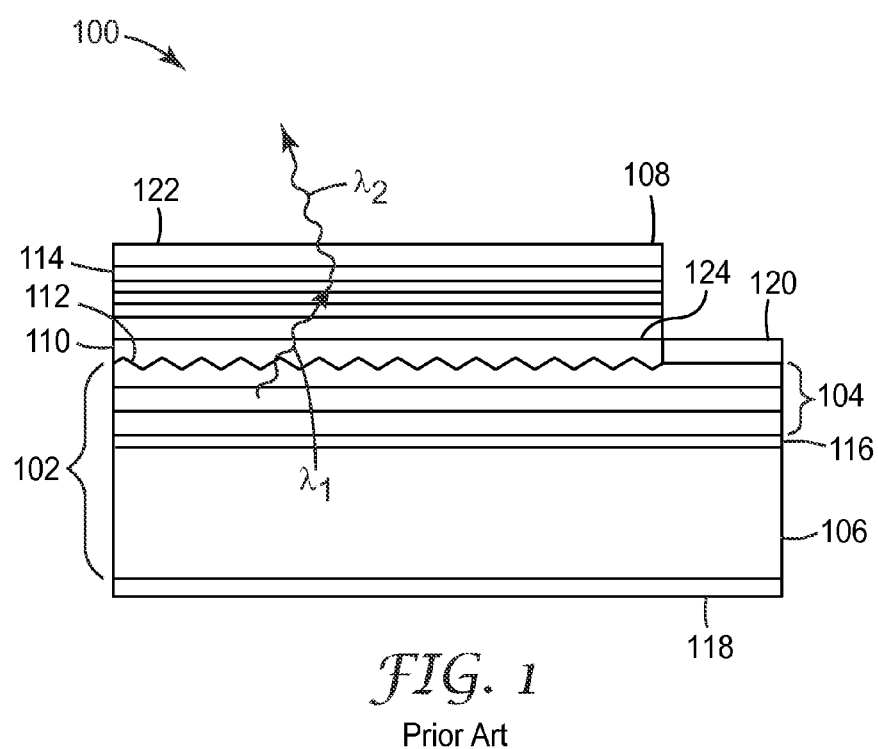
FIG. 1 is a schematic side view of a combination LED/RSC device.
Figure 2:
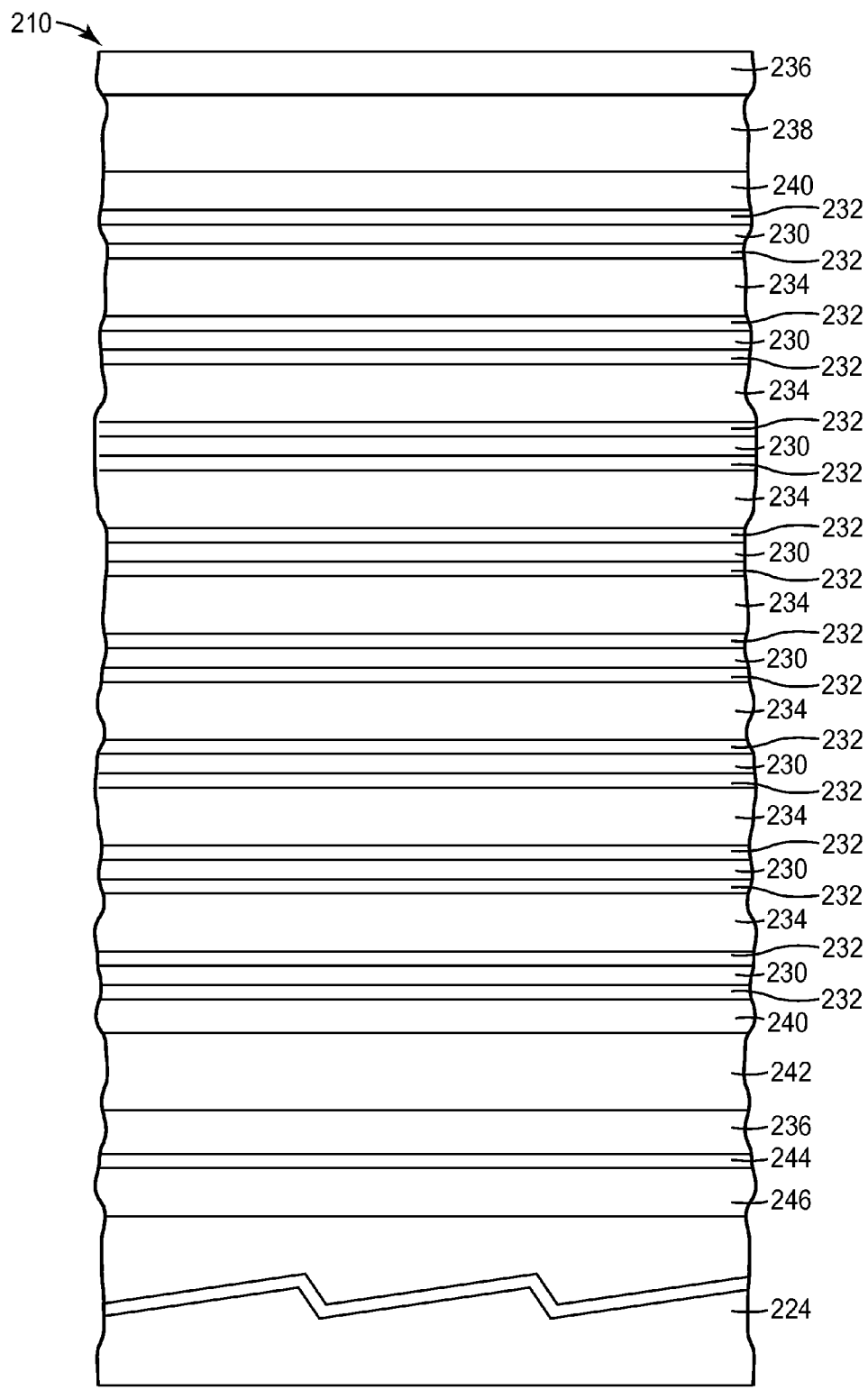
FIG. 2 is a schematic side view of an exemplary semiconductor layer stack that includes an RSC.

We begin with a discussion of general principles and design considerations relating to semiconductor constructions in general and re-emitting semiconductor constructions (RSCs) in particular. As mentioned above, RSC devices operate via a photoluminescent conversion process. That is, pump light photons with energy greater than the band gap of the absorbing material generate electron-hole pairs, which recombine and emit photons of energy at or near the band gap of the emitting layer. Although the converting structure can in principle be a homogeneous semiconductor, the efficiency of a homogeneous layer is low due to the fact that carriers created at the surface have a relatively high probability of non-radiative recombination. Therefore, higher efficiencies can be obtained via more complex structures such as lattice-matched heterostructures where the band gap is engineered from one layer to the next so as to create potential wells confining the carriers, and window layers preventing their diffusion to free surfaces. Even higher efficiency can be obtained by using potential wells of small enough size so that quantum confinement effects promote radiative recombination.

To fabricate a high-efficiency semiconductor down-conversion structure using quantum confinement, typical layers of the structure and related design considerations include one or more potential well layers, absorber layers, and window layers. To achieve efficient conversion, all of these layers, to the extent they are included in the RSC, are preferably either grown mutually lattice-matched or grown pseudomorphically, to prevent generation of structural defects that promote non-radiative recombination. We review now design considerations for each of these types of layers.

Potential well layers have band gap energies ($E_{pw}$) nominally the same as, but may be slightly smaller than, the emitted photon energy ($E_e$) desired. Differences between the band gap energy $E_{pw}$ and the emission energy $E_e$ are due to the energy levels associated with quantization in the well, in cases where the thickness of the potential well layer is sufficiently small. Although light emission at any color or wavelength, and combinations thereof, are contemplated in the disclosed embodiments, of particular interest in display-type applications as well as general lighting applications is visible light and particularly red, green, and blue light. Therefore, of particular interest in RSC design are potential well layers capable of emitting at least red light and/or green light, and in some cases blue light. (In many cases, blue light is supplied by an electroluminescent device such as an LED that is coupled to the RSC, and thus in those cases the RSC need not contain potential well layers designed to emit blue light.) The terms "red", "green", or "blue" can reasonably be applied to a significant range of photon energies (or wavelengths), but for purposes of discussion one may select a representative photon energy of about 2 eV (corresponding to a wavelength of about 620 nm) or even 1.9 eV (wavelength of about 650 nm) for red, and a representative photon energy of about 2.3 eV (wavelength of about 540 nm) for green. These values should not be considered as limiting, but they provide the device designer some guidance when considering the suitability of a particular material for a potential well layer.

Absorber layers have band gap energies ($E_a$) smaller than the photon energy of most of the pump light spectrum, so that most of the pump light is absorbed and converted to electron-hole pairs. Given the typical spectral width (or range of photon energies) of the pump light, the band gap of the absorber $E_a$ is desirably a few hundred meV smaller than the photon energy $E_{pump}$ at the peak of the pump light spectrum. For efficient absorption, a difference exceeding about 200 meV is desirable. Note also that absorber layers can form the "walls" or "barriers" that confine carriers in the potential wells. The difference between the barrier height $E_a$ and the potential well energy $E_{pw}$ is preferably significantly greater than the available thermal energy at the operating temperature of the device (T). Typically, $E_a$-$E_e$, or $E_a$-$E_{pw}$, is greater than 10 $K_B T$, where $K_B$ is Boltzmann's constant and T is the operating temperature in degrees Kelvin, in order to minimize the temperature dependence of the photoluminescence intensity. Difference values greater than 200 meV, and preferably on the order of 300 meV, are desirable.

Window layers have band gap energies ($E_w$) higher than the pump photon energy distribution, to allow efficient penetration of the pump light to the absorber layer(s) and/or potential well layer(s). For a typical GaInN pump LED, the window band gap is desirably about 200 meV or more above the photon energy $E_{pump}$ at the center of the LED spectrum, i.e., the peak wavelength of the pump light. Note that this consideration, combined with the desire to have the pump light effectively absorbed in the absorber layer, means that there may be a difference of about 400 meV or more between the band gap of the absorber and the band gap of the window, thereby automatically providing a barrier to prevent carriers generated at the window-absorber interface from diffusing to the outer window surface and combining non-radiatively.

Figure 3:
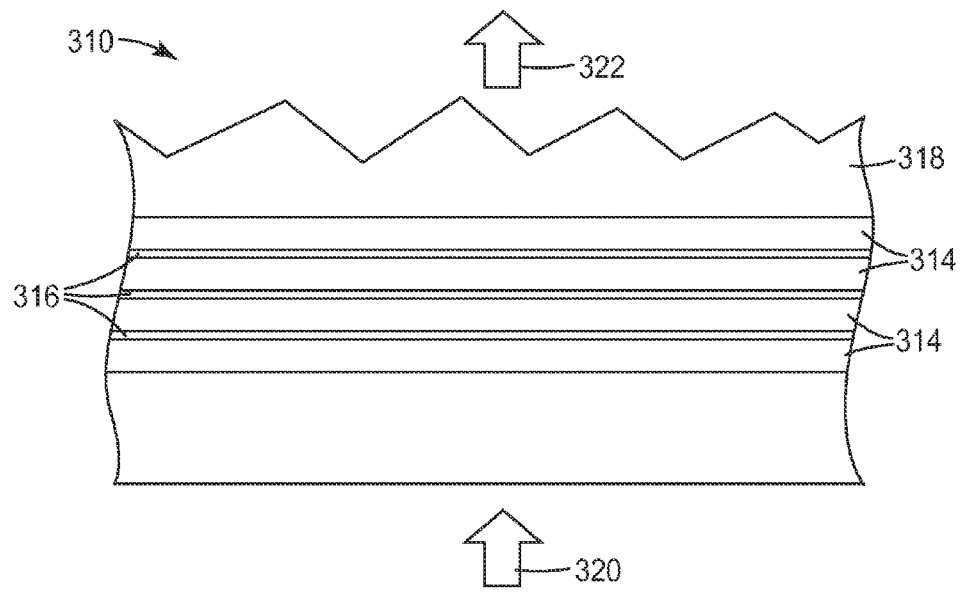
FIG. 3 is a schematic sectional view of a semiconductor construction that includes an RSC.
Figure 4:
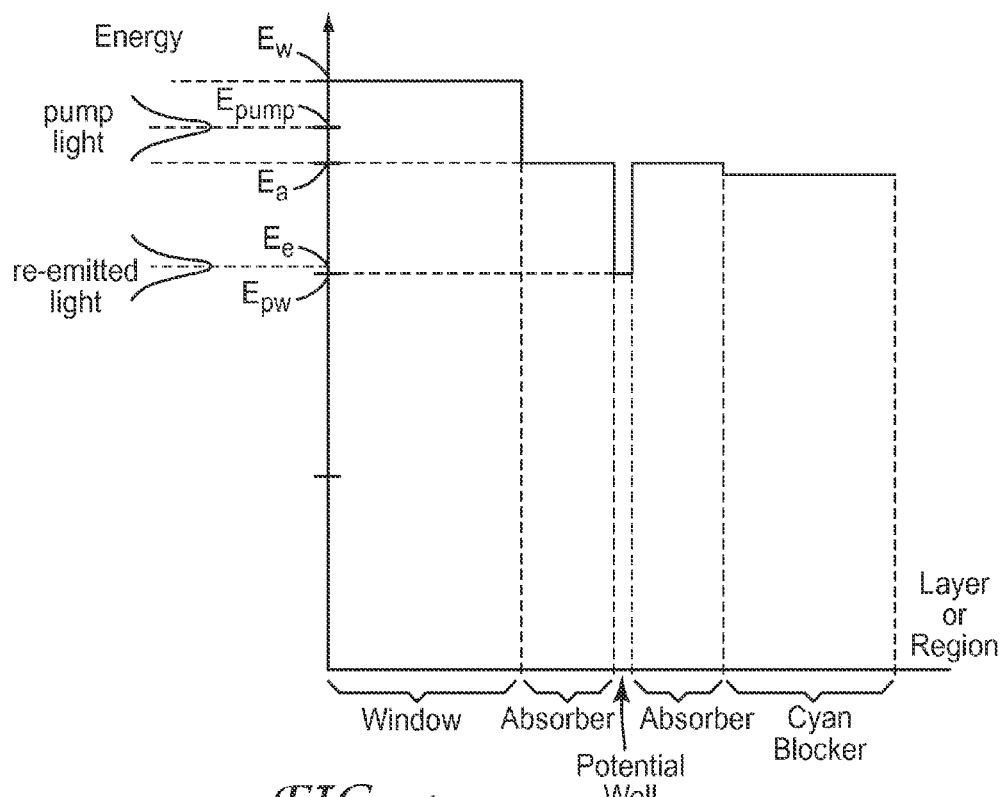
FIG. 4 is an energy diagram that helps explain suitable band gap energies for various layers that may be found in an RSC.

FIGS. 3 and 4 are provided in support of the foregoing discussion of design considerations.

In FIG. 3, a semiconductor construction such as an RSC 310 is shown in schematic sectional view. The RSC 310 is shown as including a semiconductor window layer 312, semiconductor absorber layers 314, semiconductor potential well layers 316, and another semiconductor layer 318, the RSC being illuminated with pump light 320 and emitting output light 322. The layer 318 may be another window layer similar to or the same as window layer 312, or it may be a light filtering layer referred to as a "cyan blocker". A cyan blocker layer can be provided with a band gap energy $E_{cb}$ on the order of and desirably somewhat less (typically a few to several tens of meV) than the band gap energy $E_a$ of the absorber layer(s), such that the cyan blocker can effectively absorb substantially all of the short wavelength light supplied by the pump light source that is transmitted by the other layers of the RSC. However, the cyan blocker band gap energy $E_{cb}$ is also desirably substantially higher than the emission energy $E_e$ so that the re-emitted light originating from the potential well(s) is highly transmitted. Reference in this regard is made to pending U.S. Application Ser. No. 61/075,918, "Semiconductor Light Converting Construction", filed Jun. 26, 2008. If the layer 318 is a cyan blocker, then output light 322 may include substantially no amount of pump light 320. On the other hand, if the layer 318 is a window layer, then output light 322 may include some (including a substantial amount) of the pump light 320, depending on the design of the absorbing layers and potential wells of the RSC 310.

In FIG. 4, energy (e.g. band gap energy or photon energy) is plotted against a horizontal axis that is subdivided to represent different types of layers or regions that may be found in an RSC. Band gap energies of a window layer ($E_w$), absorber layers ($E_a$), potential well ($E_{pw}$), and cyan blocker are shown, as well as peak energies of a pump light distribution ($E_{pump}$) and of light re-emitted by the potential well ($E_e$). In accordance with the foregoing discussion, it is desirable to maintain the following approximate relationships between the various parameters:

$E_w \gtrsim E_{pump} + 0.2$ eV $E_a \lesssim E_{pump} - 0.2$ eV $E_a \gtrsim E_e + 10*K_B*T$, or $E_a \gtrsim E_e + 0.3$ eV $E_a \gtrsim E_{pw} + 10*K_B*T$, or $E_a \gtrsim E_{pw} + 0.3$ eV $E_e = 2$ eV (red light)

$E_e = 2.3$ eV (green light)

These relationships can be readily maintained in RSC devices that incorporate cadmium-containing semiconductor materials, such as CdMgZnSe alloys. In the CdMgZnSe alloy system, closely-lattice-matched materials having all the desired band gap values, whether for red emission and/or green emission, can be achieved by appropriately varying the alloy composition. For this reason CdMgZnSe is a highly advantageous alloy system for use in RSCs designed for use in full-color emission (e.g., RGB) applications.

Figure 5:
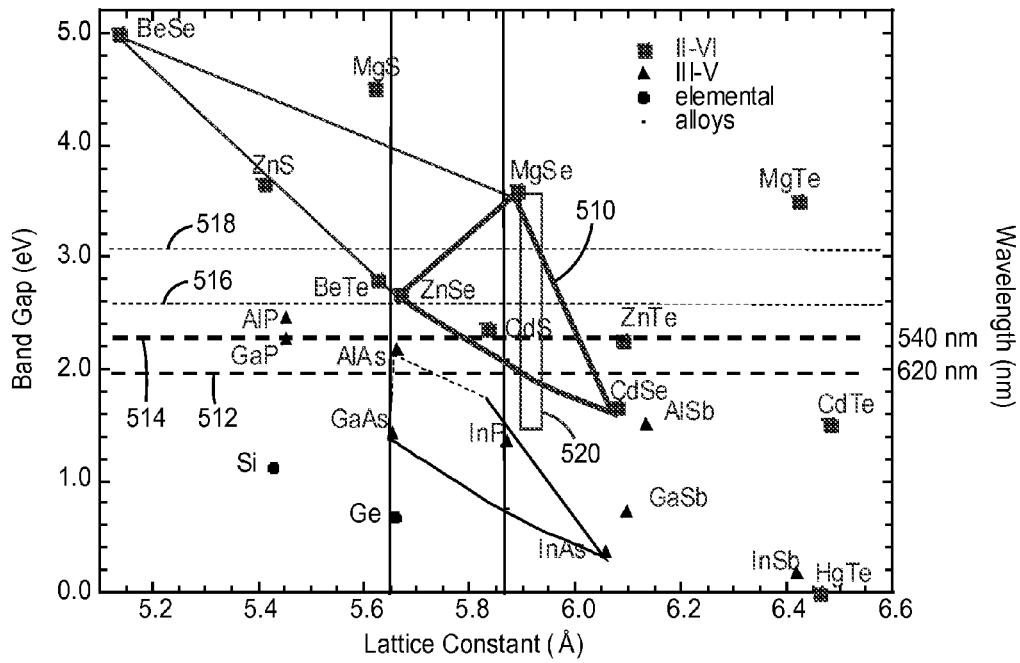
FIGS. 5 and 6 are graphs indicating lattice constant and band gap energy for a variety of II-VI and III-V semiconductor compounds and individual elements.

The band gap vs. lattice constant diagram of FIG. 5, which plots the characteristics of a variety of II-VI and III-V semiconductor compounds and elemental semiconductor crystals, demonstrates this advantage. The region 510 bounded by bold lines corresponds to the range of band gap versus lattice constant values accessible in CdMgZnSe alloys. Also included in the figure is a line 512 representing a band gap energy corresponding to red emission (~620 nm), a line 514 representing a band gap energy corresponding to green emission (540 nm), a line 516 representing a band gap energy 300 meV larger than that of the green emission and thus appropriate for an absorber layer in many embodiments, and a line 518 representing a band gap energy 500 meV above line 516, and thus appropriate for a window layer in many embodiments.

In FIG. 5, a rectangular region 520 indicates a zone in which lattice-matched layers appropriate for both red and green emission, as well as for the absorber layers and window layers, can be grown. Note that even in this CdMgZnSe material system, alloys suitable for use as red-emitting potential well layers are not perfectly lattice-matched to InP, so that such alloys may need to be grown with a small compressive strain if the overall structure is to be pseudomorphic to an InP growth substrate. It is also apparent from FIG. 5 that, without the inclusion of Cd or Hg in the semiconductor alloy, there is no II-VI material that has a direct band gap energy small enough to emit red light at 620 nm.

Notably, however, in the absence of cadmium but with the addition of tellurium, we have found that it is possible to make lattice-matched alloys that are appropriate at least for green emitting down-conversion structures. This is shown in the band gap vs. lattice constant diagram of FIG. 6, where the region 610 bounded by bold lines indicates the region of possible band gap energies and lattice constants available in a MgZnSeTe alloy system. Such alloys, including alloys of ZnSeTe, can be made using known epitaxial growth processes in layer form with little or no cadmium, e.g., less than 0.01% Cd by weight, or less than 0.001% Cd by weight, in a homogeneous layer or layers. Such alloys can also be made in layer form with little or no mercury, e.g., less than 0.1% Hg by weight, or less than 0.01% Hg by weight, in a homogeneous layer or layers. Such alloys can also be made to comply with the RoHS Directive.

Figure 6:
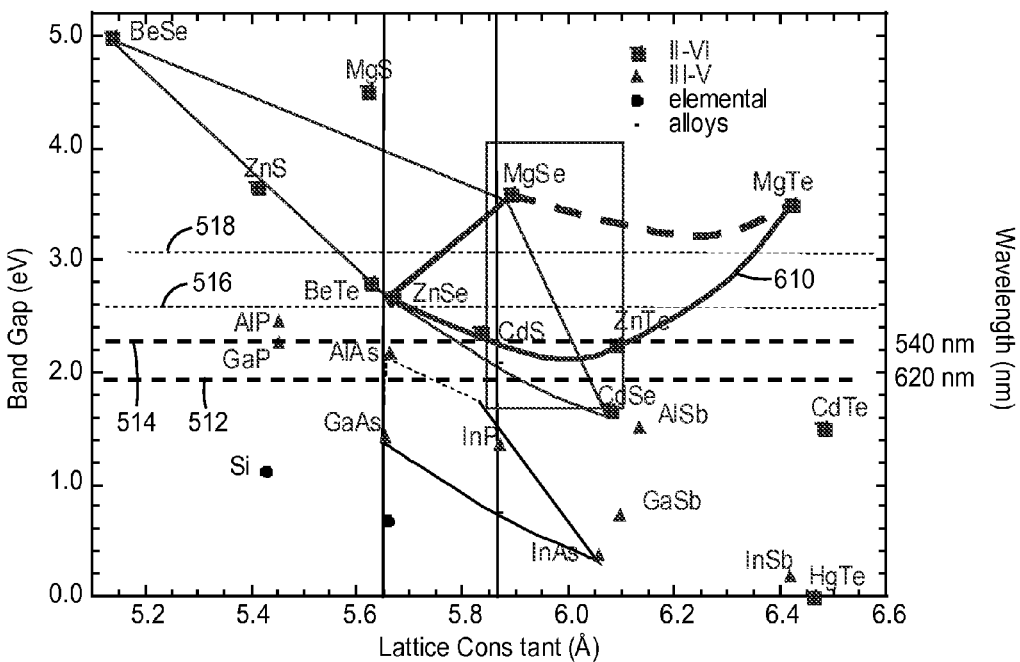

The MgZnSeTe system (region 610) of FIG. 6 is a promising option for substantially Cd-free monochrome green emission in RSC devices, and the MgZnSeTe layers are compatible for growth on an InP substrate. Appropriate MgZnSeTe-based alloys, including alloys of ZnSeTe, for green-emitting potential wells, absorber layers, and also window layers can be lattice-matched to InP substrates. This is so despite a lack of consensus in the technical community at the present time regarding the precise relationship between the band gap energy vs. composition in an upper portion of the region 610 corresponding to the MgSeTe alloy subsystem, indicated in FIG. 6 by the dashed or broken appearance of one of the bold lines forming the border of region 610.

An exemplary green-emitting down-converter layer structure for use with blue pump light (e.g. 450 nm peak wavelength) is provided in Table 2. This structure uses MgZnSeTe-based alloys, including alloys of ZnSeTe, for the window layer, absorber layer, and potential well of the construction. The listed compositions are approximate, due to the uncertainty in the band gap vs lattice constant values.

TABLE 2

| Growth sequence | Composition | Thickness (nm) | Band gap energy (eV) | Comment |
|---|---|---|---|---|
| 5 | $Mg_{0.6}Zn_{0.4}Se_{0.6}Te_{0.4}$ | 500 | 3.0 | Window layer |
| 4 | $Mg_{0.3}Zn_{0.7}Se_{0.5}Te_{0.5}$ | 100 | 2.6 | Absorber layer |
| 3 | $ZnSe_{0.5}Te_{0.5}$ | 2 | 2.2 | Quantum well |
| 2 | $Mg_{0.3}Zn_{0.7}Se_{0.5}Te_{0.5}$ | 500 | 2.6 | Absorber layer |
| 1 | $Ga_{0.47}In_{0.53}As$ | 100 | | III-V etch stop |
|  | InP | (very large) | | III-V substrate |

Of course, embodiments similar to that of Table 2 but containing additional potential wells and additional absorber layers, optionally also including a cyan blocker layer, can also be made using MgZnSeTe-based alloys. The band gap energy ($E_{pw}$) of the quantum well shown in the table has a value of 2.2 eV, which, due to quantum effects, is expected to produce re-emitted light having a peak energy between about 2.2 and 2.3 eV, i.e., green light.

The reader will understand that in later processing steps, the semiconductor layers forming the RSC can if desired be bonded to an electroluminescent pump source such as a blue-emitting LED, in such a way that the window layer (growth sequence 5 in Table 2) lies between the LED and the potential well (growth sequence 3 in Table 2), after which the InP growth substrate is removed such as by etching to allow the green light generated by the potential well to escape the RSC. This configuration of the semiconductor layer stack, in which the surface of the RSC that is designed to face the pump light source is a surface of the last-grown RSC device layer, is referred to as the "standard orientation". The semiconductor stacks disclosed herein can also be fabricated using an "inverted orientation", in which the surface of the RSC that is designed to face the pump light source is a surface of the first-grown RSC device layer. If the inverted orientation is used, a carrier window made of glass or other suitable material can be attached to a side of the stack opposite the growth substrate, and the growth substrate can then be removed, before attaching the RSC to the pump light source. Reference in this regard is made to U.S. Application Ser. No. 61/175,636, "Re-Emitting Semiconductor Carrier Devices For Use With LEDs and Methods of Manufacture", filed May 5, 2009, and incorporated herein by reference.

Given the selection of MgZnSeTe alloy (including ZnSeTe alloy) as the material for a cadmium-free green-emitting RSC, the challenge facing the device designer, in those cases where it is desirable to combine both green and red emission in a single device, is then to identify an efficient cadmium-free material suitable for use as a red-emitting potential well that is compatible with this green converter. This can be readily accomplished via hybrid integration of a III-V layer for down-conversion to the red.

For red-emitting potential wells, the AlGaInP alloy system, lattice-matched to a GaAs substrate, is an excellent candidate. This alloy system may be considered to include GaInP materials. Some AlGaInP alloys are used commercially to make high-efficiency red LEDs; such materials can also be used to make good optical down-converters.

Figure 7:
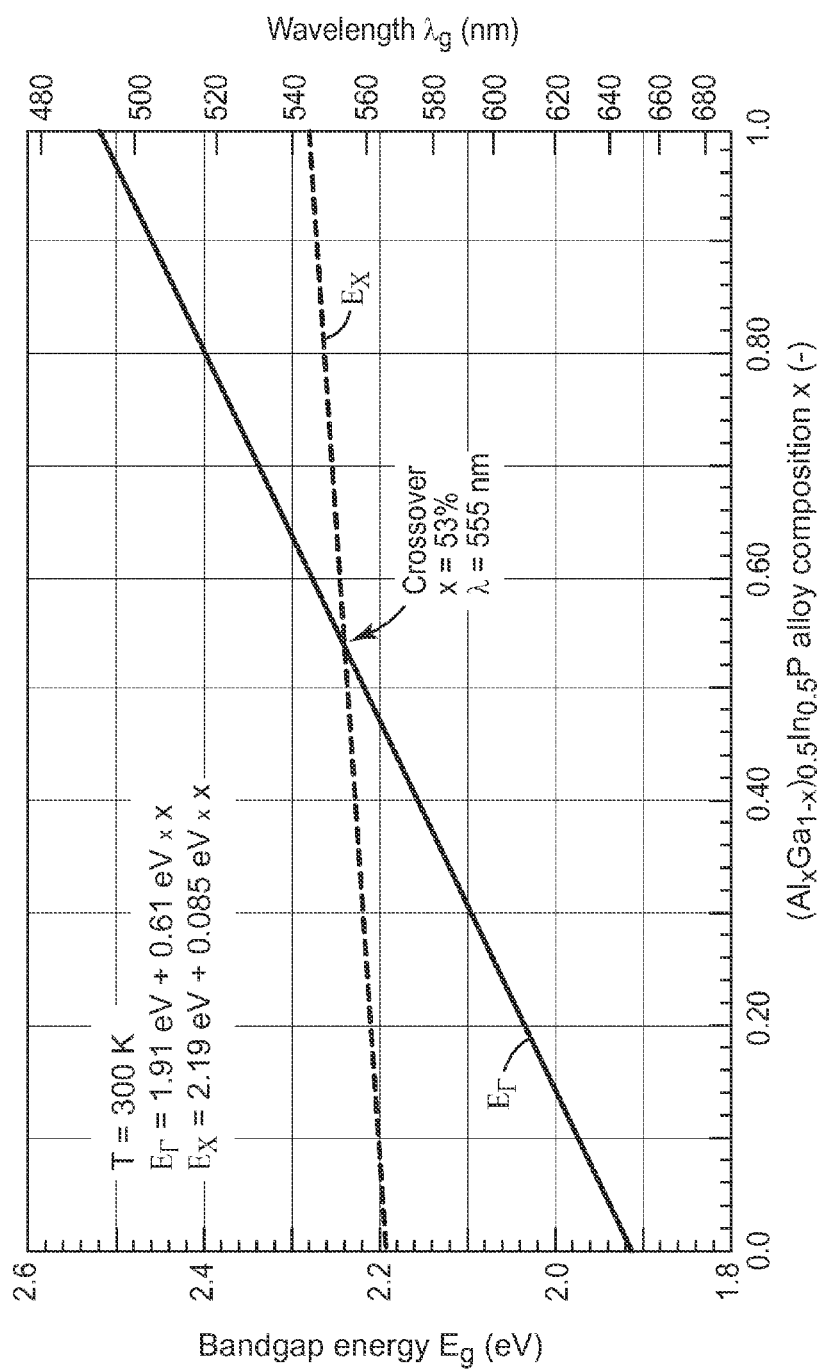
FIG. 7 is a graph of band gap energy vs. composition for AlGaInP alloys.

A graph of band gap energy versus composition for AlGaInP alloys that are lattice matched to GaAs, i.e., compositions of the form $(Al_xGa_{1-x})_{0.5}In_{0.5}P$, is shown in FIG. 7. The data in the figure were obtained from E. F. Schubert, *Light-Emitting Diodes,* Cambridge University Press, Cambridge, UK. With these compositions, direct band gap energies between 1.9 eV (653 nm) and 2.2 eV (555 nm) can be achieved. To produce a potential well emitting at a red wavelength of 620 nm (2.0 eV), a composition with x≈0.10 can be used. To produce an absorber layer whose band gap is 0.2 eV above the potential well energy, a composition with x≈0.46 can be used.

To produce a window layer whose band gap energy is large enough to efficiently transmit pump light, we can look to semiconductor materials other than AlGaInP alloys but which are compatible with such alloys. A typical RSC system may use, for example, blue pump light with a peak wavelength of about 450 nm (2.8 eV). In order to avoid blue pump absorption in the window layer, the band gap energy of the window is desirably greater than about 3.0 eV. FIG. 7 illustrates that no such composition of AlGaInP exists.

However, it is possible to produce II-VI alloys lattice-matched to GaAs with band gap energies greater than 3.0 eV that can serve as windows for blue pumping of the red emitter. A promising candidate for this application is BeMgZnSe, which can be grown lattice-matched on GaAs with a band gap as large as 3.1 eV (at a composition of $Be_{0.14}Mg_{0.26}Zn_{0.6}Se$). Employing this material as the window layer, an exemplary layer structure for a red-emitting RSC down-converter to be used with blue pump light (450 nm, or 2.76 eV) is set forth in Table 3:

TABLE 3

| Growth sequence | Composition | Thickness (nm) | Band gap energy (eV) | Comment |
|---|---|---|---|---|
| 5 | $Be_{0.14}Mg_{0.26}Zn_{0.6}Se$ | 500 | 3.1 | Window layer |
| 4 | $(Al_{0.46}Ga_{0.54})_{0.5}In_{0.5}P$ | 100 | 2.2 | Absorber layer |
| 3 | $(Al_{0.1}Ga_{0.9})_{0.5}In_{0.5}P$ | 2 | 1.97 | Quantum well |
| 2 | $(Al_{0.46}Ga_{0.54})_{0.5}In_{0.5}P$ | 500 | 2.2 | Absorber layer |
| 1 | AlGaAs | 100 | | III-V etch stop |
|   | GaAs | (very large) | | III-V substrate |

Again, embodiments similar to that of Table 3 but containing additional potential wells and additional absorber layers, optionally also including a cyan blocker layer, can also be made using AlGaInP- and BeMgZnSe-based alloys. The band gap energy ($E_{pw}$) of the quantum well shown in the table has a value of 1.97 eV, which, due to quantum effects, is expected to produce re-emitted light having a peak energy of about 2 eV, i.e., red light.

An alternative approach to direct blue pumping of the red-emitting potential well is to use blue pumping of a green-emitting potential well, and then use the green emission from this potential well to pump a red-emitting potential well. Such an arrangement is referred to as "double down conversion". With this arrangement, if a window layer is used with the red-emitting potential well, it can have a lower band gap energy than if direct blue pumping were used. For example, if the green emission from the first potential well has a peak at 540 nm (2.3 eV), then in order to avoid absorption of any substantial portion of the green emission, the band gap energy of the window used with the red-emitting potential well is desirably greater than about 2.5 eV. (This compares with a desired band gap for the window layer of greater than about 3 eV for direct blue light pumping referred to above.) From FIG. 6 it is evident that ZnSe with a small amount of either Be or S added can provide a II-VI material having a direct band gap energy of about 2.7 eV and that is lattice matched to GaAs. Such a material is thus suitable for a window layer. An exemplary RSC layer structure employing a red-emitting potential well for use with green (540 nm) pumping is set forth in Table 4. The composition listed for Be is approximate.

TABLE 4

| Growth sequence | Composition | Thickness (nm) | Band gap energy (eV) | Comment |
|---|---|---|---|---|
| 5 | $Be_{0.03}Zn_{0.97}Se$ | 500 | 2.7 | Window layer |
| 4 | $(Al_{0.46}Ga_{0.54})_{0.5}In_{0.5}P$ | 100 | 2.2 | Absorber layer |
| 3 | $(Al_{0.1}Ga_{0.9})_{0.5}In_{0.5}P$ | 2 | 1.97 | Quantum well |
| 2 | $(Al_{0.46}Ga_{0.54})_{0.5}In_{0.5}P$ | 500 | 2.2 | Absorber layer |
| 1 | AlGaAs | 100 | | III-V etch stop |
|   | GaAs | (very large) | | III-V substrate |

The band gap energy ($E_{pw}$) of the quantum well is again 1.97 eV, corresponding to the emission of red light. Embodiments similar to that of Table 4 but containing additional potential wells, absorber layers, and/or a cyan blocker layer, can also be made using AlGaInP- and BeZnSe-based alloys.

It is also possible for semiconductor materials having an indirect band gap to be used for the lattice-matched window material of the AlGaInP/GaAs red down converter. For example, $Al_{0.5}In_{0.5}P$ (indirect band gap energy of about 2.28 eV) or $Be_{1-x}Zn_xTe$ ($x \leqq 0.1$, indirect band gap energy of about 2.7 eV), may be suitable as a window for green pumping of the red-emitting potential well.

In view of the foregoing, one can see that a substantially Cd-free red-emitting potential well, comprising for example a III-V semiconductor such as alloys of AlGaInP or GaInP, can be combined with a Cd-free lattice-matched window layer, comprising for example a II-VI semiconductor such as alloys of BeMgZnSe, BeZnSe, MgZnSSe, or BeZnSSe, as well as Cd-free lattice-matched absorber layer(s), to provide a semiconductor stack or RSC that is also substantially Cd-free, if desired. Further, a Cd-free green-emitting potential well, for example a II-VI semiconductor such as alloys of MgZnSeTe, ZnSeTe, BeMgZnSe, or MgZnSSe, can be combined with a Cd-free lattice-matched window layer, for example another II-VI semiconductor such as alloys of MgZnSeTe, ZnSeTe, BeMgZnSe, or MgZnSSe, as well as Cd-free lattice-matched absorber layer(s), to provide a semiconductor stack or RSC that is also substantially Cd-free, if desired. In some cases, the II-VI semiconductor layers of a semiconductor construction can be grown on a cadmium-containing substrate or buffer layer, e.g., a CdZnSe buffer layer, but such buffer layer and substrate can subsequently be removed by etching or by other suitable techniques so that the finished semiconductor construction or device is substantially Cd-free.

Using either the direct-pumping approach or the double-down approach for generating red light, along with a Cd-free II-VI semiconductor such as the MgZnSeTe or ZnSeTe alloys of Table 2 for generating green light, RGB pixels for full-color displays, as well as non-pixelated white emitters, may be fabricated.

Figure 8:
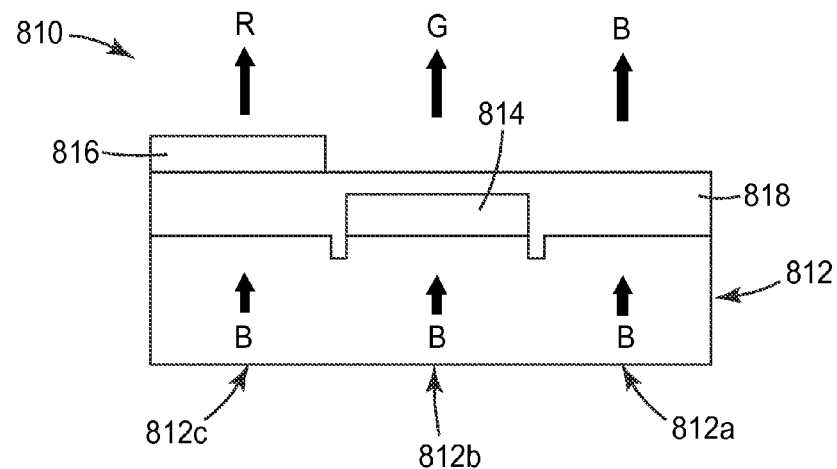
FIG. 8 is a schematic sectional view of an RGB light source using blue pump light sources and RSCs as disclosed herein.

FIG. 8 is a schematic sectional view of a pixelated RGB light source 810 that includes a blue-emitting electroluminescent device 812, such as an GaInN LED, in combination with a blue-pumped, green-emitting RSC 814 and a blue-pumped, red-emitting RSC 816, as disclosed herein. Any or all of these components may be substantially Cd-free, and may comply with the RoHS Directive. The electroluminescent device 812 includes three separately addressable blue-emitting sources 812a, 812b, 812c. Blue light emission from source 812a is allowed to exit the source 810 without any down-conversion by any RSC. Blue pump light emission from source 812b is intercepted by RSC 814, which down-converts the blue pump light to green light emission with little or no residual blue light. The RSC 814 may comprise a potential well that is composed of a II-VI semiconductor, such as alloys of MgZnSeTe, ZnSeTe, BeMgZnSe, or MgZnSSe. Blue pump light emission from source 812c is intercepted by RSC 816, which down-converts the blue pump light to red light emission with little or no residual blue light. The RSC 816 may comprise a potential well that is composed of a III-V semiconductor, such as alloys of AlGaInP or GaInP.

In FIG. 8, the epilayers comprising the green- and red-emitting RSCs may be grown separately on different substrates, for example the green emitter may be grown on an InP substrate, while the red emitter may be grown on a GaAs substrate. In such a case, the RSCs can be bonded to the electroluminescent device 812, and patterned into pixels, in separate process steps. The bonding of the red-emitting RSC to the structure can be facilitated by providing a planarization layer 818 over the electroluminescent device 812 with the patterned green-emitting RSC or pixel(s) 814. In the configuration of FIG. 8, the planarization layer 818 is desirably highly transparent to both the blue emission of the electroluminescent device 812, and the green emission of RSC 814.

Although only one composite RGB pixel is shown in FIG. 8, the reader will understand that the source 810 can contain a large array of such pixels.

Figure 9:
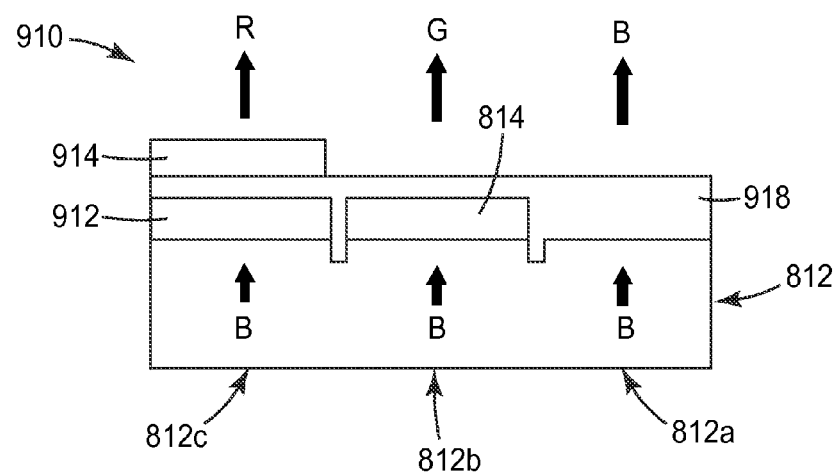
FIG. 9 is a schematic sectional view of another RGB light source.

FIG. 9 is a schematic sectional view of another pixelated RGB light source 910. This light source also includes the blue-emitting electroluminescent device 812, with its separately addressable blue-emitting sources 812a, 812b, 812c. Light source 910 can include the same blue-pumped, green-emitting RSC 814 as described in connection with FIG. 8. However, light source 910 can also include a blue-pumped, green-emitting RSC 912, and a green-pumped, red-emitting RSC 914. Any or all of these components may be substantially Cd-free, and may comply with the RoHS Directive, as described herein.

Similar to the embodiment of FIG. 8, blue light emission from source 812a is allowed to exit the source 910 without any down-conversion by any RSC. Also like the FIG. 8 embodiment, blue pump light emission from source 812b is intercepted by RSC 814, which down-converts the blue pump light to green light emission with little or no residual blue light. The RSC 814 may comprise a potential well that is composed of a II-VI semiconductor, as described above. Blue pump light emission from source 812c is intercepted by RSC 912, which down-converts some or all of the blue pump light to green light emission, optionally with some residual blue pump light also. The green and optional blue light is then intercepted by RSC 914, which down-converts the green and optional blue light to red light emission. The RSC 914 may comprise a potential well that is composed of a III-V semiconductor, such as alloys of AlGaInP or GaInP.

In similar fashion to FIG. 8, the epilayers comprising the green- and red-emitting RSCs in the embodiment of FIG. 9 may be grown separately on different substrates. The different types of RSCs can thus be bonded to the electroluminescent device 812, and patterned into pixels, in separate process steps. The bonding of the red-emitting RSC to the structure can be facilitated by providing a planarization layer 918 over the electroluminescent device 812 with the patterned green-emitting RSC or pixel(s) 814, 912. As before, the planarization layer 918 is desirably highly transparent to both the blue emission of the electroluminescent device 812, and the green emission of RSCs 814, 912.

The devices of FIGS. 8 and 9 may be fabricated using processes that include the following steps: bond the green-emitting RSC semiconductor stack to the blue pump LED; remove the growth substrate (e.g., InP) from the RSC semiconductor stack; fabricate extraction features on the green-emitting RSC; pattern the green-emitting RSC into pixels; overcoat with a transparent material and planarize the device; bond the red-emitting RSC to the planarized device (blue LED with pixelated green converter(s)); remove the growth substrate (e.g. GaAs) from the red-emitting RSC; fabricate extraction features on the red-emitting RSC; pattern the red-emitting RSC into pixels; fabricate vias for electrical connections to the pump LED.

Figure 10:
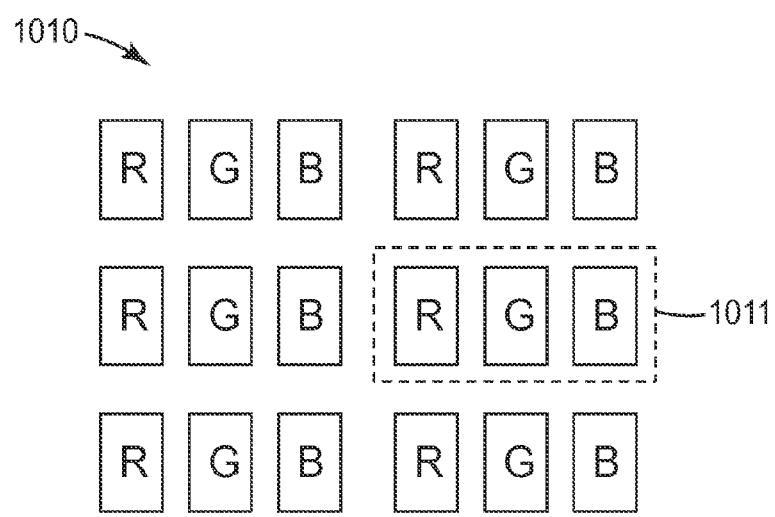
FIG. 10 is a schematic top view of a color imaging system that includes an array of composite RGB picture elements (pixels) based on RSCs.

FIG. 10 is a schematic top view of an area 1010 of an image-generating system, or a portion thereof, based on arrays of composite RGB picture elements or pixels. Each of the composite or full-color RGB pixels 1011 is composed of a group of three component color elements, sometimes referred to as "sub-pixels": one ("R") emitting red light, one ("G") emitting green light, and one ("B") emitting blue light. Six full-color pixels 1011 are shown in FIG. 10, although fewer than six or many more than six, e.g., tens, hundreds, or thousands, may be used as desired. The full-color pixels 1011 may be realized as in FIGS. 8 and 9, where the red and green emission are provided by RSC elements, whereas the blue light is directly provided by the blue LED array that also serves to pump the red and green emitters. Alternatively, the blue light may also be provided by an RSC, and the pump LED elements may be chosen to emit light with a wavelength shorter than blue, such as violet. For image formation, each of the red, green, and blue emitters in the image generating system 1010 are desirably independently addressable. This may be accomplished via either "active" or "passive" matrix schemes. In the active matrix approach, each pump LED element is associated with a dedicated switching circuit, so that a logical signal applied to the switch results in drive current being applied to the pump LED element. In the passive matrix approach, the anodes and cathodes of the pump LED elements are connected to row and column electrodes; application of sufficient potential across the electrodes contacting the anode and cathode of a particular pixel results in emission of light from that pixel.

Details of approaches for fabrication of pixel arrays based on RSCs are described in PCT Publications WO 2008/109296 A1 (Haase) and WO 2009/048704 A2 (Kelley et al.), as well as the following commonly assigned U.S. Application Ser. Nos. 61/059,073 , filed Jun. 5, 2008; 61/088,953 , filed Aug. 14, 2008; 61/095,205 , filed Sep. 8, 2008; and 61/140,697 ), all incorporated herein by reference.

Light extraction features that may be used on the various RSC devices include overcoated particles, nanostructures, as well as etched structures, including wet and/or dry etching, and including extraction features such as those disclosed in U.S. Application Ser. No. 61/175,640, "Re-Emitting Semiconductor Construction With Enhanced Extraction Efficiency", filed May 5, 2009, and incorporated herein by reference.

Red- and green-emitting RSCs made in this way may be used to produce large full-color RGB pixels for adaptive illumination, or small RGB pixels for image formation. Alternatively, they can be used to make fixed-spectrum white emitters, either by patterning the red and green emitters, or without patterning by designing the red-emitting RSC to transmit some green and blue light, and designing the green-emitting RSC to transmit some blue light, to make a non-pixelated white light emitter. In still other embodiments, stand-alone green-emitters, red-emitters, or emitters of other colors/ wavelengths or combinations of colors/wavelengths can be made. Using the teachings of the present application, each of these embodiments can be made with potential wells, absorber layers, window layers, and other constituent semiconductor layers that may make up the RSC (as well as other device components that may not comprise semiconductors, such as bonding materials, connecting wires, electrical contact materials, encapsulant materials, and so forth) that may all be substantially Cd-, Hg-, and/or As-free, and that comply with the RoHS Directive, such that each such device itself may also be substantially Cd-, Hg-, and/or As-free, and comply with the RoHS Directive.

The teachings of the present application can also be used to produce devices or constructions that, considered as a whole, may be considered to be substantially free of cadmium and/or other selected materials such as mercury and/or arsenic, even though the device or construction may include one or more component that, considered by itself, is not substantially free of such selected material(s), and that indeed may contain a relatively significant or even large amount of such selected material(s). In such embodiments, component(s) of the device/construction that contain significant or large amounts of cadmium and/or the other selected material(s) can be compensated for by other component(s) of the device/construction that are free or substantially free of such material(s), such that, on average, the device/construction considered as a whole has a relatively small amount of such material(s). In the case of a stack of semiconductor layers that forms an RSC, the RSC may, for example, include a potential well layer composed of a semiconductor material whose cadmium concentration may be 5% by weight, or 10% by weight, for example. However, other semiconductor layers in the stack, e.g., window layer(s) and/or absorber layer(s), may contain little or no cadmium, e.g., they may be substantially Cd-free when considered separately. The collective weight or mass of the layer(s) that contain little or no cadmium may be large enough, relative to the weight or mass of the potential well layer containing a significant or large amount of cadmium, so that the semiconductor stack as a whole maintains a low overall amount of cadmium, e.g., less than 0.01% by weight, and that may comply with the RoHS Directive. In alternative embodiments a similar semiconductor stack, which forms an RSC, may be made, and may contain a plurality of potential well layers, any or all of which may individually contain a significant or large amount, e.g., greater than 0.01%, greater than 0.1%, greater than 1%, or greater than 5 or 10% by weight, of cadmium or other selected material(s). In such embodiments other layer(s) of the semiconductor stack may be substantially Cd-free, and these Cd-free layer(s) may account for a large enough fraction of the stack that the semiconductor stack as a whole maintains an amount of cadmium that is very small, e.g., less than 0.01% by weight, such that the RSC formed by the stack complies with the RoHS Directive, for example. Note that in cases such as this where one or more constituent layers of the RSC is not substantially Cd-free but the RSC as a whole is substantially Cd-free, the Cd-containing layer(s) may be one or more potential well layers or may be one or more other constituent layers that comprise the RSC.

The Cd-, Hg-, and/or As-free embodiments as disclosed herein would likely be considered undesirable, and prior to the present teachings may well have been disregarded or dismissed as impractical, by those skilled in the art, in view of aspects of the present embodiments that may be considered disadvantageous relative to conventional embodiments that may employ, for example, only cadmium-containing materials such as CdMgZnSe. Such perceived disadvantages may include: added process complexity, requiring two wafer bonding steps to attach red- and green-emitting RSCs to the pump LED wafer; added cost associated with the consumption of two, rather than only one, expensive substrates (e.g., one InP wafer and one GaAs wafer) per wafer of pump LEDs used; limitations to the upper limit of band gap energy, particularly with regard to absorber layers used in red-emitting RSCs, thus potentially sacrificing temperature stability or performance; the efficiency of potential wells composed of ZnSeTe alloys is not well understood, and may be too low for some applications; the quality of MgZnSeTe and ZnSeTe alloys is not well understood, and may be inadequate for some applications.

In addition to the specific materials and structures discussed above, other approaches for realizing red, green, and/or blue emitters, pixelated RGB emitters, white light emitters, and other color emitters, any or all of which may be substantially Cd-, Hg-, and/or As-free, and that may comply with the RoHS Directive, are possible. In one approach, the green emitter can be grown monolithically with the blue-emitting electroluminescent device, e.g., a GaN-based blue pump light emitting LED. In such cases, the green emitter can be pumped either optically by the blue emission of the LED, or electrically. Reference in this regard is made to devices that employ quantum dots in AlGaInN semiconductors, e.g., U.S. Pat. No. 7,217,959 (Chen) and U.S. Patent Application Publication US 2005/0230693 (Chen). Red emission may then be provided using optical down-converting potential wells such as the AlGaInP or GaInP structures discussed in connection with Tables 3 and 4 above.

In other embodiments, the green and red emitters can be grown monolithically. For example, a red-emitting potential well or RSC utilizing AlGaInP- or GaInP-alloys, grown on a GaAs substrate as described above, can then be used as substrate for growth of a green-emitting potential well or RSC based on compressively-strained ZnSeTe quantum wells. In such cases, absorber layers and/or window layers can be fabricated from BeMgZnSe or MgZnSSe semiconductor alloys lattice-matched or pseudomorphic to GaAs.

Also contemplated herein are red-emitting potential wells or RSCs using other III-V material systems, such as alloys from the dilute nitride semiconductor system based on AlIn-GaAsNPSb. Reference is made to U.S. Patent Application Publication US 2008/0111123 (Tu et al.). In one approach, potential wells based on $In_{0.1}Ga_{0.9}N_{0.002}P_{0.998}$ and emitting near 625 nm can be grown lattice-matched to a GaP substrate. GaP can be used as absorber layer(s) for pumping at 420 nm, and a lattice-matched window layer composed of ZnS or ZnSSe can also be used.

Finally, the reader is again reminded that the approaches described herein for producing hybrid pixel arrays containing red, green, and blue elements can also be used for generating cadmium-free versions of single-color down-converted semiconductor devices, as well as multi-line or white down-converted semiconductor devices.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A semiconductor construction, comprising:
    a first potential well for converting light having a first photon energy to light having a smaller second photon energy, the first potential well comprising a first III-V semiconductor; and
    a window having a band gap energy greater than the first photon energy, the window comprising a first II-VI semiconductor;
        wherein the window is substantially Cd-free.

2. The construction of claim 1, wherein the first potential well is pseudomorphic.

3. The construction of claim 1, wherein the semiconductor construction is compliant with the RoHS Directive.

4. The construction of claim 1, wherein the light having the first photon energy comprises UV, violet, blue, and/or green light, and the light having the second photon energy comprises red light.

5. The construction of claim 1, wherein the construction is pseudomorphic and disposed on a substrate comprising a second III-V semiconductor, and
    wherein the second III-V semiconductor comprises GaAs.

6. The construction of claim 1, wherein the first II-VI semiconductor comprises BeMgZnSe or BeZnSe.

7. The construction of claim 1, wherein the first II-VI semiconductor comprises MgZnSSe or BeZnSSe.

8. The construction of claim 1, wherein the first potential well is a component of a stack of pseudomorphic semiconductor layers including one or more absorber layers and optionally one or more additional potential wells, and wherein the stack of semiconductor layers is substantially Cd-free.

9. A light emitting system, comprising:
    the construction of claim 1 disposed on a light source adapted to emit light having the first photon energy; and
    a second potential well for converting light having the first photon energy to light having a third photon energy smaller than the first photon energy and greater than the second photon energy, the second potential well comprising a second II-VI semiconductor.

10. The system of claim 9, wherein the second potential well is substantially Cd-free.

11. The system of claim 9, wherein the second potential well is a component of a stack of pseudomorphic semiconductor layers including one or more absorber layers and optionally one or more additional potential wells, and wherein the stack of semiconductor layers as a whole is substantially Cd-free.

12. The system of claim 9, wherein the second II-VI semiconductor comprises MgZnSeTe, ZnSeTe, BeMgZnSe or MgZnSSe.

13. A light emitting system, comprising:
    the construction of claim 1;
    a light source adapted to emit light having a third photon energy greater than the first photon energy; and
    a second potential well for converting the light having the third photon energy to the light having the first photon energy, the second potential well comprising a second II-VI semiconductor.

14. The system of claim 13, wherein the second potential well is substantially Cd-free.

15. The system of claim 14, wherein the second II-VI semiconductor comprises MgZnSeTe, ZnSeTe, BeMgZnSe or MgZnSSe.

16. The system of claim 13, wherein the second potential well is a component of a stack of pseudomorphic semiconductor layers including one or more absorber layers and optionally one or more additional potential wells, and wherein the stack of semiconductor layers as a whole is substantially Cd-free.

17. The system of claim 13, wherein the light having the third photon energy comprises UV, violet, and/or blue light, the light having the first photon energy comprises green light, and the light having the second photon energy comprises red light.

18. The system of claim 13, wherein the second potential well is disposed between the light source and the construction of claim 1.

* * * * *